(12) United States Patent
Biehler et al.

(10) Patent No.: US 11,531,069 B2
(45) Date of Patent: Dec. 20, 2022

(54) BATTERY LIFE TIME BASED ON SENSOR DATA

(71) Applicant: Schneider Electric Industries SAS, Rueil Malmaison (FR)

(72) Inventors: Aymeric Biehler, Saint-Laurent-du-Var (FR); Didier Ferry, Le Broc (FR); Ghislain Rudelou, Le Rouret (FR)

(73) Assignee: Schneider Electric Industries SAS, Rueil Malmaison (FR)

( * ) Notice: Subject to any disclaimer, the term of this patent is extended or adjusted under 35 U.S.C. 154(b) by 222 days.

(21) Appl. No.: 16/865,636

(22) Filed: May 4, 2020

(65) Prior Publication Data

US 2020/0363477 A1 Nov. 19, 2020

(30) Foreign Application Priority Data

May 14, 2019 (EP) .................................. 19305613

(51) Int. Cl.
 *G06F 11/30* (2006.01)
 *G01R 31/3842* (2019.01)
 *G01R 31/392* (2019.01)
 *H02J 7/00* (2006.01)
 *G01R 31/36* (2020.01)
 *H03K 17/00* (2006.01)

(52) U.S. Cl.
 CPC ..... *G01R 31/3842* (2019.01); *G01R 31/3648* (2013.01); *G01R 31/392* (2019.01); *H02J 7/005* (2020.01); *H03K 17/005* (2013.01)

(58) Field of Classification Search
 CPC .................................................. G01R 31/3842
 See application file for complete search history.

(56) References Cited

U.S. PATENT DOCUMENTS

| | | | |
|---|---|---|---|
| 2007/0247118 A1* | 10/2007 | Ho ..................... | G01R 31/3647 320/134 |
| 2008/0036904 A1 | 2/2008 | Taneoka | |
| 2014/0008984 A1* | 1/2014 | Kamiyama ............... | H02J 9/06 307/64 |
| 2014/0145680 A1 | 5/2014 | Mullin et al. | |
| 2019/0101951 A1* | 4/2019 | Sather ............... | H01M 10/0585 |

OTHER PUBLICATIONS

Extended European Search Report for EP Patent Application No. EP19305613.2 dated Oct. 7, 2019, 9 pages.

\* cited by examiner

*Primary Examiner* — Phuong Huynh
(74) *Attorney, Agent, or Firm* — Locke Lord LLP

(57) ABSTRACT

A system for controlling supply of a device. The device can be a power retention device that requires to be permanently powered. To this end, it can be alternatively powered by a power supply, in a first mode, or by a battery, in a second mode. At least one sensor of the system acquires data related to the battery, such as environmental data, the voltage of the battery or the discharge current of the battery. Based on the data and at least one characteristic curve of the battery, a battery monitoring module is configured to switch between the first and second modes to improve the lifetime of the battery.

16 Claims, 7 Drawing Sheets

BATTERY LIFE TIME BASED ON SENSOR DATA

BACKGROUND

The present invention relates to monitoring of a battery life cycle, in particular, while not exclusively, in the context of solid-state batteries.

Batteries or supercapacitors are generally used to provide power to devices when it is not powered by another power source. In particular, power retention devices such as Real Time Clocks, RTC, require to be continually powered, even in case of power supply outage. To this end, traditional back-up systems integrate supercapacitors or chemical batteries to provide power in any situation. For example, when the output voltage of the power source drops below a threshold value, the back-up battery can be used to power the data retention device.

The wording "power retention device" designates any device that embeds a critical function that should not be interrupted, even when the power source is turned off or is defective, such as a memory or an RTC for example.

RTCs are used in many applications, and in particular in industrial automation Control Processing Units, CPUs, or in Remote Terminal Unit, RTU, modules.

Once fully or partly discharged, a battery can be charged by being powered by a power source. However, the number of charge cycles of a battery is limited and depends on the battery technology (traditional or solid-state batteries for example), on the depth of discharge and on many other factors.

In addition, batteries are very sensitive to operating conditions and the battery life cycle is strongly dependent on these operating conditions.

RTC retention time is generally 40 days guaranteed over a given temperature range during 10 years. To reach this, there is a need to extend the lifetime of the batteries that are used for powering data retention devices such as RTC.

SUMMARY OF INVENTION

It is an object of the invention to alleviate at least some of the disadvantages mentioned above.

A first aspect of the invention concerns a system for controlling supply of a device comprising:
  a battery;
  a power supply;
  a device being alternatively powered by the battery or by the power supply;
  at least one sensor configured for sensing data related to the battery;
  a battery monitoring module operatively coupled to a switch and configured to control the switch for switching, based at least on the data and at least one predefined curve, between a first mode where the load and the battery are powered by the power supply and a second mode where the device is powered by the battery, said predefined curve being a characteristic curve of the battery.

Therefore, the battery monitoring module enables to alternate between the first and second modes to improve the battery lifetime, as characteristic curves of the battery and environmental data acquired by sensors are taken into account.

According to some embodiments, the at least one sensor may comprise one or several among:

a temperature sensor arranged for sensing a temperature of the battery;
  a humidity sensor arranged for sensing a humidity ratio of an environment of the battery,
  a pressure sensor arranged for sensing pressure of the environment of the battery;
  a vibration sensor arranged for sensing vibrations around the battery; and
  a shunt and an amperemeter arranged for determining a load value applied to the battery.

Therefore, the data acquired by the sensor is data that impacts the operation and the lifetime of the battery.

According to some embodiments, at least one predefined curve may represent voltage of the battery depending on a discharge of the battery, for several temperature values, and the at least one sensor may comprise a temperature sensor arranged for sensing a temperature of the battery.

Therefore, the discharge of the battery can be managed by the battery monitoring module, for different temperature conditions.

Alternatively, or in complement, at least one predefined curve may represent voltage of the battery depending on a discharge of the battery, for several load values and the at least one sensor may comprise a shunt and an amperemeter arranged for measuring a load value applied to the battery.

Therefore, the discharge of the battery can be managed by the battery monitoring module for different load conditions.

Alternatively, or in complement, the battery monitoring module may determine, based on the at least one predefined curve and based on a maximum discharge speed, a minimum voltage value of the battery, and, when in the second state, if the voltage of the battery reaches the minimum voltage value, the battery monitoring module switches in the first mode.

Therefore, the battery monitoring module ensures that the discharge speed of the battery remains below the maximum discharge speed, thereby improving the lifetime of the battery.

Alternatively or in complement, the battery monitoring module may control a load-shedding system in case of current overload. In particular, when the battery is in charge of powering equipments other than the device, some of the other equipments may be relieved and disconnected from the power battery, to enable powering of the device without interruption.

According to some embodiments, the switch may have a controllable slew rate and the slew rate of the switch may be below a predefined value.

The controllable slew rate enables to avoid a peak of current in the battery when switching to the second mode, and therefore extends the battery lifetime.

In complement, the switch may have a switching speed greater than 10 kHz.

According to some embodiments, the battery may be powered by a voltage regulator between the battery and the power supply in the first mode.

The voltage regulator regulates the voltage delivered by the power supply to charge the battery.

According to some embodiments, the system may further comprise a current limiter between the voltage regulator and the battery, and the current limiter may be configured to limit a charge current delivered to the battery in the first mode.

The current limiter enables to slowly charge the battery, which extends the lifetime of the battery.

According to some embodiments, the battery monitoring module may be further configured for controlling environment conditions of the battery based on the data.

For example, the battery monitoring module may control the temperature, the humidity, the pressure, to avoid deteriorating the battery, thereby extending its lifetime.

According to some embodiments, the battery monitoring module may comprise a counter, the counter may be configured to be launched when the battery monitoring module switches to the first mode, and, if the counter reaches a prefixed counter value, the battery monitoring module may switch to the second mode.

This enables to extend the lifetime of the battery.

According to some embodiments, the at least one characteristic curve may represent a variation of a battery capacity depending on number of charge cycles.

Managing the number of charge cycles enables to extend the lifetime of the battery.

According to some embodiments, the battery may be a solid-state battery.

Solid-state batteries have on average a longer lifetime than batteries using liquid electrolyte.

According to some embodiments, the device may be a real-time clock.

A real-time clock requires to be permanently powered so that the system according to the invention is well suited for this application.

According to some embodiments, the battery monitoring module may further comprise an interface configured for increasing the voltage that is delivered by the power supply.

This enables to store more power in battery. The counterpart is that it limits the life cycle of the battery, which is however compensated by the above technical features of the invention. Therefore, a minimum autonomy (40 days for example) during a minimum life cycle (such as 10 years for example) can be ensured even when the power stored in the battery exceeds the nominal power of the battery. This embodiment therefore enables to use the same battery architecture with different RTC consuming different levels of power.

A second aspect of the invention concerns a method for controlling supply of a device in a system comprising a device being alternatively powered by a battery or by a power supply, the method comprising the following operations:
  sensing data related to the battery;
  controlling a switch for switching, based at least on the data and one at least one predefined curve, between a first mode where the load and the battery are powered by the power supply, and a second mode where the device is powered by the battery, said predefined curve being a characteristic curve of the battery.

Further objects, aspects, effects and details of the invention are described in the following detailed description of number of exemplary embodiments, with reference to the drawings.

BRIEF DESCRIPTION OF DRAWINGS

By way of example only, the embodiments of the present disclosure will be described with reference to the accompanying drawing, wherein.

DETAILED DESCRIPTION

Figure 1:
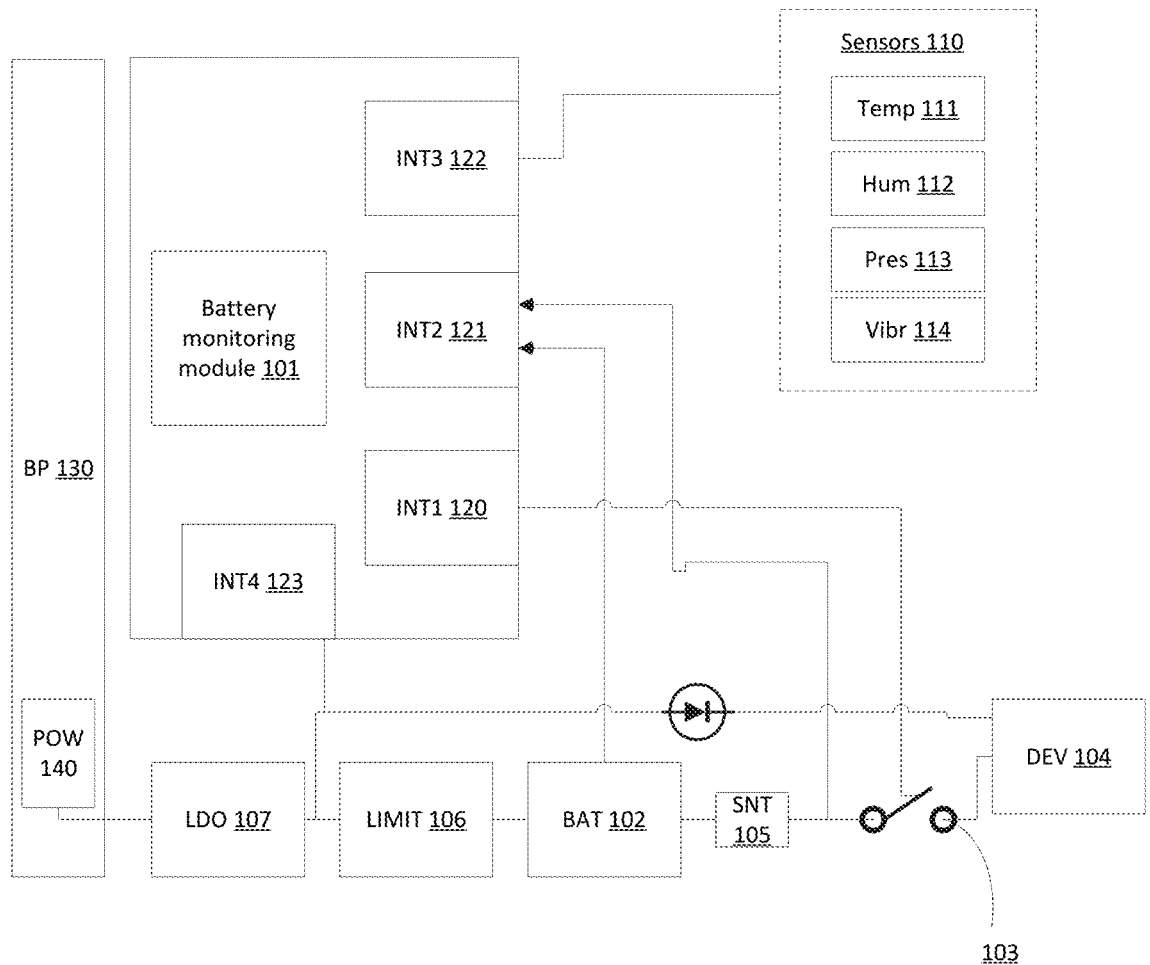
FIG. 1 illustrates a system according to some embodiments of the invention.

Referring to FIG. 1, there is shown a system according to some embodiments of the invention.

The system comprises a device 104, in particular a power retention device in the context of the invention, alternatively powered by a battery 102 or by a power source 140. In what follows, the device 104 is considered as being a Real Time Clock, RTC. However, no restriction is attached to the device 104 which can be any device requiring power retention, such as a memory or a low power, LP, Remote Terminal Unit, RTU or any device that has a function that requires to be permanently powered. As it can be powered by the battery 102, the device 104 may be called "load of the battery" hereafter.

The RTC 104 may be integrated to a larger entity, other modules of the larger entity being synchronized based on the RTC signal for example.

The power source 140 may be an external supply or may be the general power supply of the larger entity. The RTC 104 may be connected to the power source 140 via a backplane 130. The backplane 130 is a board to which the components of the larger entity are connected.

The power source 140 may be a voltage source that provides a voltage of 24 Volts, V. However, no restriction is attached to the voltage/current level that is delivered by the power source 140.

The system comprises a battery monitoring module 101 operatively coupled to a switch 103 via a first interface 120. The battery monitoring module 101 may be a microcontroller, such as a microcontroller STM32 F301. A microcontroller designates any computing unit on a single integrated circuit. However, no restriction is attached to the battery monitoring module 101, which may alternatively comprise separate components such as a processor executing a software for performing the steps of the method according to the invention, and memories such as a Random Access Memory, RAM, and a Read Only Memory, ROM, storing the instructions, and input/output interfaces. At least some components of the battery monitoring module 101 may also be virtualized in a cloud. In that case, the system according to the invention further comprises a network interface to access a network such as an IP network for accessing the virtualized components.

The battery monitoring module 101 is configured to open or close the switch to disconnect/connect the battery to the RTC 104, and to switch between a first mode and a second mode. No restriction is attached to the switch 103 which encompasses any entity that is configured to open and close the circuit (or more generally to significantly vary the resistance value between two points of the circuit).

According to the first mode, the device 104 and the battery 102 are powered by the power source 140, and the switch 103 is open. According to the second mode, the device 104 is powered by the battery 102 and the switch 103 is closed.

The battery monitoring module 101 may also measure the current flowing through the battery 102 and the voltage of the battery 102, via the second interface 121, by means of a shunt resistor 105 between the battery 102 and the switch 103. This discharge current corresponds to the load value of the battery. The load value can be expressed as a multiple of the nominal discharge current of the battery. For example, if the nominal discharge current of the battery is 100 µA, a load value of 500 µA is noted 5 C.

The second interface 121 may be an analog-to-digital converter, ADC, interface.

According to the invention, the battery monitoring module 101 is also connected to at least one sensor 110. Referring to FIG. 1, four sensors 111 to 114 are represented, for illustrative purposes only:
- a temperature sensor 111 arranged for sensing the temperature of the battery 102 or around (in the vicinity of) the battery 102;
- a humidity sensor 112 arranged for sensing a humidity ratio of the environment of the battery 102;
- a pressure sensor 113 arranged for sensing the air pressure around the battery 102;
- a vibration sensor 114 arranged for sensing vibrations around the battery 102.

The system may comprise other sensors, of any types, that are not represented on FIG. 1. The shunt resistor 105 coupled with the interface 121 can also be regarded as a sensor for accessing to the discharge current of the battery supplied to the load.

Actually, the wording "sensor", in the context of the invention, encompasses any device that is configured to acquire data related to the battery 102.

The battery monitoring module 101 may be connected to the sensor(s) 110 via a Dual Master Bus on the I2C1 pins I2C1-SDA and I2CA-SCL.

As explained hereafter, the battery monitoring module 101 is configured to consider data issued from at least one sensor to manage charge and discharge of the battery using the switch 103. The battery monitoring module 101 also considers at least one predefined curve, the predefined curve being a characteristic curve of the battery 102. A characteristic curve may be provided by the manufacturer of the battery. A characteristic curve may also be derived from manufacturer data. For example, it can be obtained by updating manufacturing data. Examples of characteristic curves will be described in what follows, referring to FIGS. 2 to 4.

The switch 103 is preferably selected to have a controllable slew rate and a high speed, such as above 10 kHz for example. This enables to minimize inrush currents when switching from powering the device 104 with the power supply 104 to powering it with the battery 102, as will be better understood referring to FIG. 5. Inrush currents are instantaneous high input currents drawn by the power supply or the device when turned on. The controllable slew rate enables to limit damages on the normalized capacity over the full temperature range (for example from −20° to 80° C.). In particular, it limits the variation of speed of the switch 103.

According to some embodiments, the battery may be a solid-state battery. A solid-state battery is a battery for which the electrolyte is a solid phase. Solid-state batteries provide the advantage, compared to liquid batteries, to have a higher energy density because of their tolerance to higher temperatures. Also, solid state batteries are safer because liquid electrolytes are generally flammable. As fewer safety systems are needed, solid-state batteries are also more compact.

No restriction is attached to the type of solid-state battery that is used. For example, the solid-state battery may be a ceramic battery. A ceramic battery is small enough to be implemented on a Printed Circuit Board, PCB.

According to some embodiments, the system may comprise a voltage regulator 107 receiving the power from the power source 140.

The voltage regulator 107 may be a Low Drop Out, LDO, regulator that can regulate the output voltage when the supply voltage (from the power source 140) is very close to the output voltage. This enables to charge the battery 102 with a constant voltage source and to power the RTC 104 at a constant voltage.

The system may also comprise a current limiter 106 between the battery 102 and the voltage regulator 107, which enables to limit the charging current to a maximum value, therefore limiting the current impact on the capacity of the battery. Indeed, the slower the charge, the higher is the charging capacity of the battery. The current limiter 106 therefore enables to improve the lifetime of the battery.

In what follows, examples of characteristic curves are given. Some of the characteristic curves may represent voltage of the battery depending on a discharge rate of the battery, for several environmental data values. The environmental data values may comprise temperature values or load values for example.

In what follows, the following general technical data of the battery 102 are considered, for illustrative purposes only:
- Nominal voltage: 1.4 V;
- Operating voltage Vop: 0 to 1.6 V;
- Nominal capacity: 100 µAh;
- Nominal discharge current: 100 µA;
- Operating temperature: between −20 and +80° C.;
- Initial inner resistance: <200Ω;
- Weight of the battery 102: 0.04 g.

However, the invention can be applied to any battery, irrespective of its general technical data. The battery monitoring module may also consider the general technical data of the battery 102 when deciding to switch between the first and second modes.

Manufacturers of batteries generally define the charge and discharge profile of their batteries based on temperature, load and normalized capacity.

Figure 2:
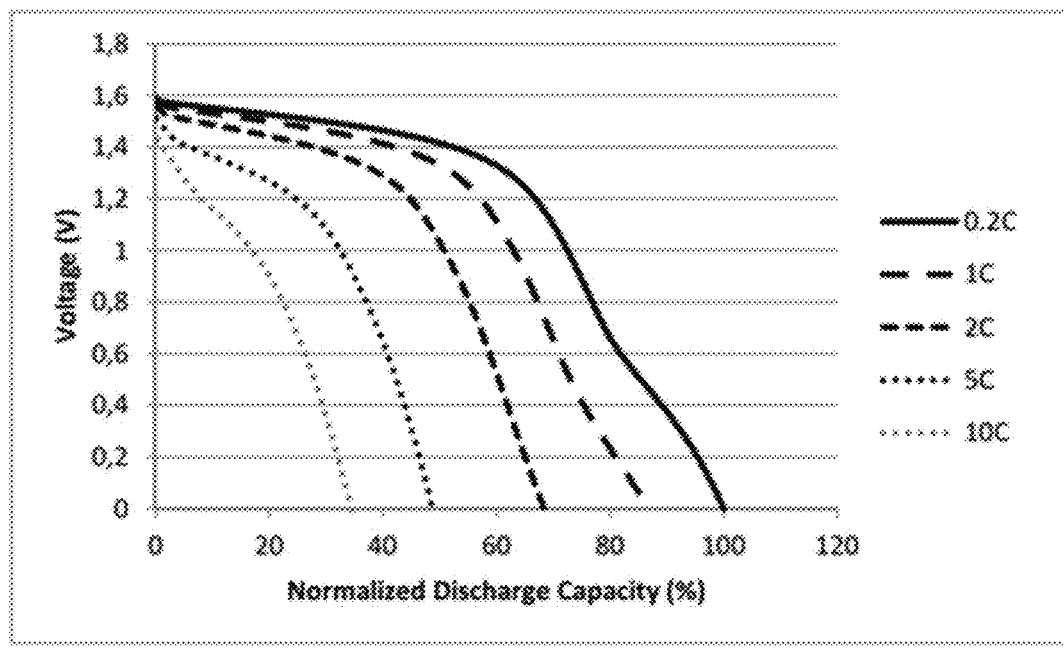
FIG. 2 illustrates a first characteristic curve of a battery in the system according to some embodiments of the invention.

Referring to FIG. 2, there is shown a first characteristic curve of the battery 102 according to some embodiments of the invention.

The first characteristic curve shows the voltage of the battery 102 depending on the discharge capacity, for different load values 0.2 C, 1 C, 2 C, 5 C and 10 C, for a given battery. Assuming that the battery 102 has a nominal discharge current of 100 µA as detailed above, the different load values respectively correspond to 20 µA, 100 µA, 200 µA, 500 µA and 1000 µA.

The first characteristic curve may also correspond to a given temperature such as 25° C. for example and to a given charge, such as a constant voltage charge with 1.6V for 3 hours. Similar curves may be obtained (from the manufacturer or experimentally) for other temperature values.

The first characteristic curve enables to anticipate, while in the second mode, fast discharge of the battery and to switch to the first mode before fast discharge has begun. To enable this, the battery monitoring module may check that the voltage of the battery, given a load value, is above a given threshold or minimum voltage value. The threshold can be determined to ensure that the discharge speed does not cross a maximum discharge speed. The threshold may vary depending on the load value or can be common to all load values (for example 1.4 V).

Then, while in the second mode, if the voltage of the battery 102 goes below the threshold value, the switch 130 is opened by the battery monitoring module 101 to switch to the first mode.

Figure 3:
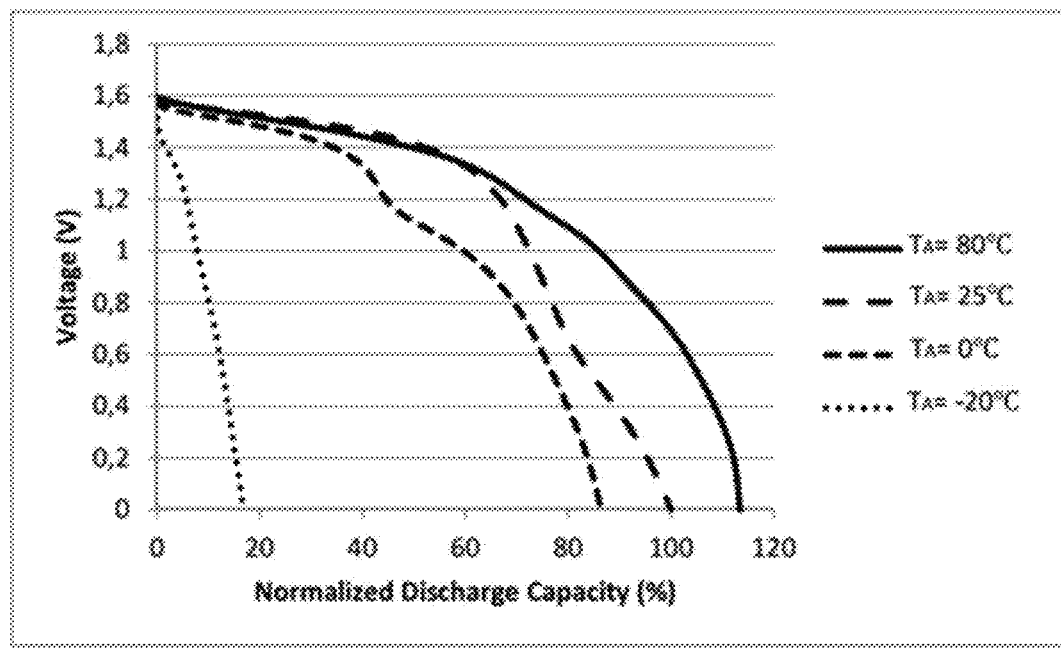
FIG. 3 illustrates a second characteristic curve of a battery in the system according to some embodiments of the invention.

Referring to FIG. 3, there is shown a second characteristic curve of the battery 102 according to some embodiments of the invention.

The second characteristic curve shows the voltage of the battery 102 depending on the discharge capacity, for different temperature values TA=−20° C.; 0° C.; 25° C. and 80° C., for a given battery.

The second characteristic curve may also correspond to a constant discharge current of 20 μA under 0 V, and to a given charge, such as a constant voltage charge with 1.6V for 3 hours. Similar curves may be obtained (from the manufacturer or experimentally) for other constant discharge currents.

The second characteristic curve enables to anticipate, while in the second mode, fast discharge of the battery and to switch to the first mode before the fast discharge has begun. To enable this, the battery monitoring module may check that the voltage of the battery, given a temperature value, is above a given threshold or minimum voltage value. The threshold can be determined to ensure that the discharge speed does not cross a maximum discharge speed. The threshold may vary depending on the temperature value or can be common to all temperature values (for example 1.4 V).

Then, while in the second mode, if the voltage of the battery 102 goes below the threshold value, the switch 130 is opened by the battery monitoring module to switch to the first mode.

According to some embodiments, the battery monitoring module 101 considers both first and second characteristic curves, for example to define a voltage threshold that applies to all load and temperature values. Based on the characteristic curves of FIGS. 2 and 3, it can be considered that a discharge voltage that does not affect the normalized discharge capacity is equal to or greater than 1.5 V. The threshold value can therefore be set to 1.5 V.

One or several criteria can be defined for the battery monitoring module 101, which then controls the switches to ensure that the criteria are met, based on the characteristic curves and the environmental data.

These criteria can be as follows:
Limiting the fast discharge of the battery by considering data from the sensors, such as load, temperature and humidity values. To this end, a voltage threshold can be set as explained above;
Limiting the depth discharge of the battery using load and temperature values. For example, a maximum depth of discharge value can be set. Based on this value, and on load and/or temperature value, a corresponding voltage threshold can be determined, and the switch 103 is controlled based on the comparison between the voltage value of the battery 102 and the voltage threshold;
Limiting the discharge at 20% of the normalized capacity by monitoring the charging profile of the battery (limiting the charging current) and also based on a discharge current analysis. Indeed, knowing the discharge current enables to access the charge or discharge capacity of the battery 102.

As explained above, the slew rate of the switch 103 can be controllable, which enables to manage the inrush currents.

Figure 4:
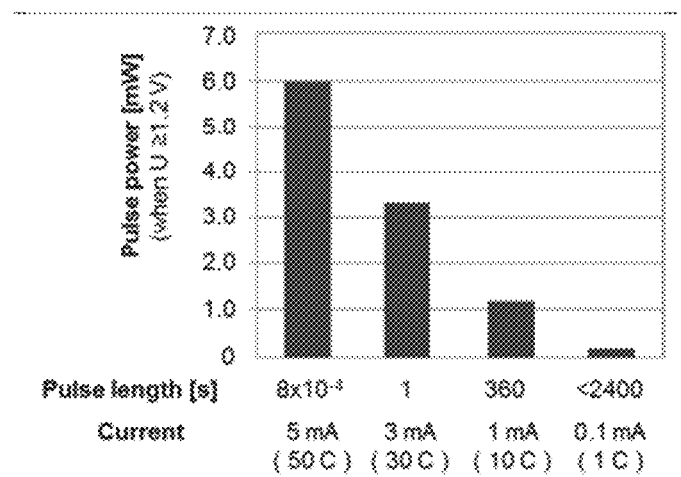
FIG. 4 is a diagram showing values of pulse power based on pulse length and the value of the discharge current of a battery in a system according to some embodiments of the invention.

FIG. 4 is a diagram showing values of the pulse power in mW based on pulse length and the value of the discharge current. These data are provided by the battery manufacturer and represent the pulse power that can be supported by the battery 102 without damaging it.

The diagram may be provided with the following table indicating the time interval for each pulse length:

| Current square pulse length | 0.8 ms | 1 s | 360 s | >2400 s |
|---|---|---|---|---|
| interval | 1 s | 30 s | none (continuous) | none (continuous) |

These data can correspond to a fixed temperature value of 25° C.

Controlling the slew rate of the switch 103 enables to limit the inrush current and enables to avoid damaging the battery. Indeed, strong inrush current would rapidly discharge the battery 103 and/or deteriorate it.

Figure 5:
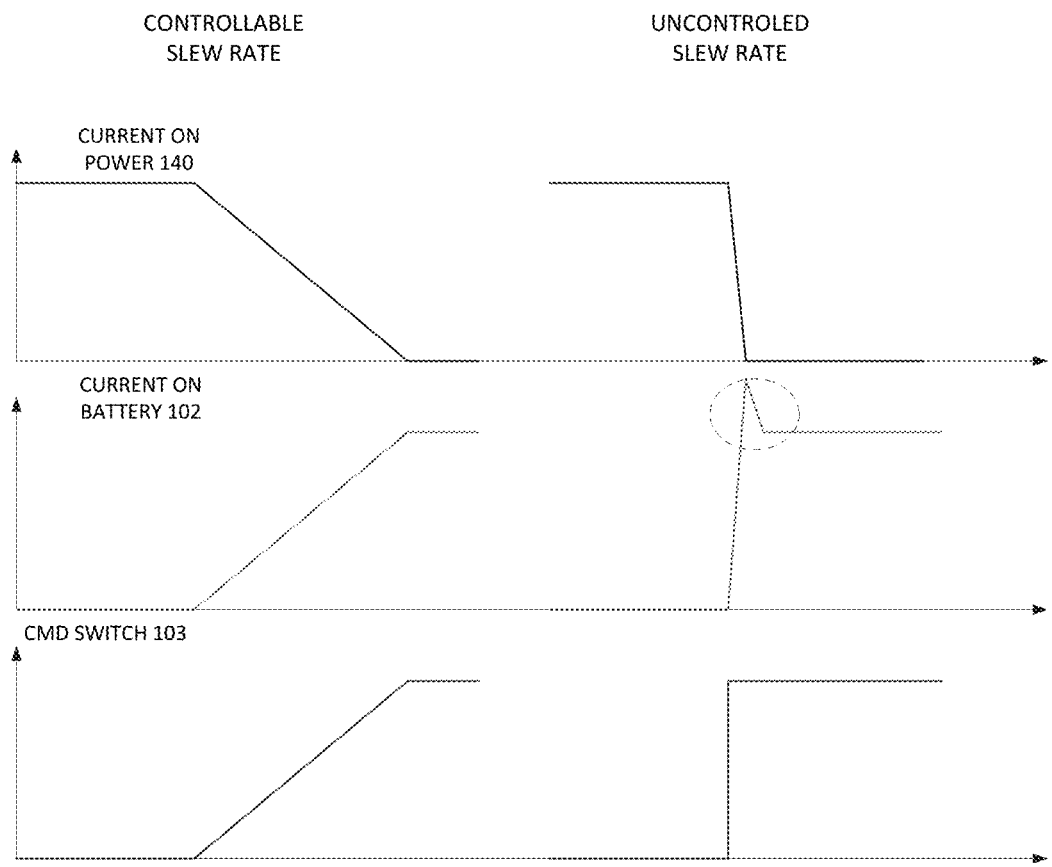
FIG. 5 shows different curves in a system with a switch having a controllable slew rate and in a system having a switch with an uncontrolled slew rate.

FIG. 5 comprises curves that illustrate the difference between a controllable slew rate (left curves) and an uncontrolled slew rate (right curves) of the switch 103.

Referring to the right curves, the bottom curve represents the command of the switch 103. As it can be observed, the switch is abruptly closed. The current delivered to the RTC by the power supply 140 also abruptly decreases until it becomes null. Regarding the current delivered by the battery, because the variation of current is abrupt, it creates a current peak above the current value that is targeted. The current peak is likely to damage the battery 103 and reduces its life time.

This peak is avoided by controlling the slew rate in accordance with the left curves, where the slope of the switch command is reduced compared to the left curves.

It is also to be noted that the battery monitoring module 101 may only switch between the first and second modes when the power source 140 is available. Even when the power source 140 is available, it is useful to switch to the second mode because the battery shall not be permanently (or over a long period) disconnected. Indeed, the battery monitoring module 101 also considers, to avoid damaging the battery and reducing its capacity, that the battery is to be regularly used. To this end, the battery monitoring module 101 may force switching to the second mode after a given period in the first mode exceeds a threshold. For this purpose, the battery monitoring module 101 may comprise a counter which is launched when the switch 103 is switched to the first mode. If the counter reaches a prefixed counter value, the battery monitoring module 101 may switch to the second mode, to avoid long disconnection times.

Figure 6:
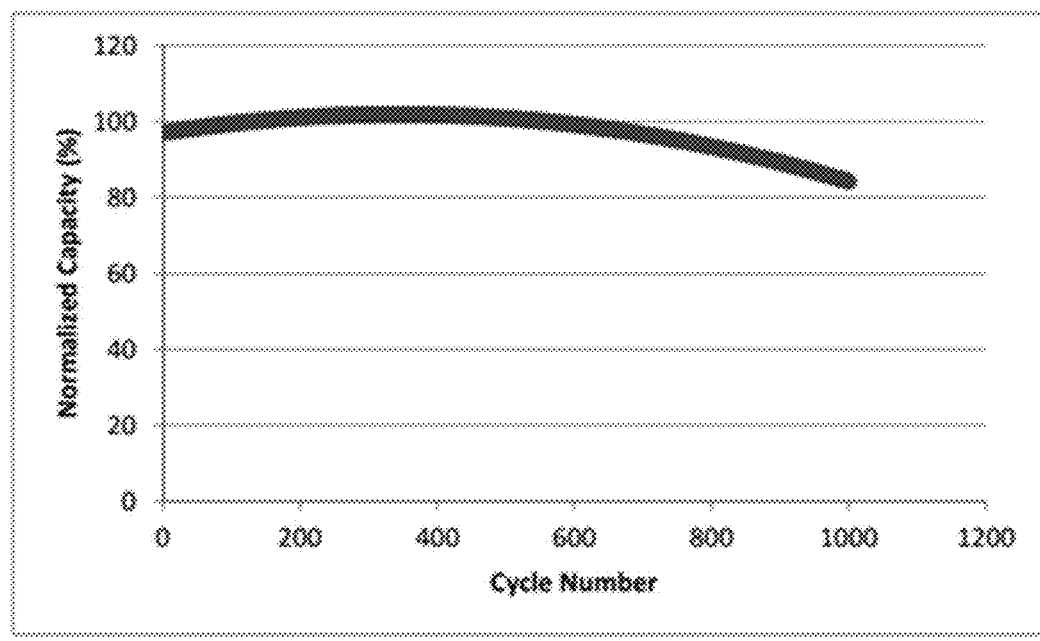
FIG. 6 is a curve illustrating the variation of the capacity of the battery depending on the cycle number.

The battery monitoring module 101 also tries to reduce the number of charge cycles of the battery 103, because, as shown on FIG. 6, the capacity of the battery decreases after a certain number of charge cycles. The battery monitoring module 101 therefore ensures a trade-off between aging of the battery due to the number of charge cycle and deterioration due to long disconnections.

By managing the battery (limiting the charging current, controlling the slew rate of the switch, and switching optimally between the first mode and the second mode) based on the sensor values and the characteristic curves, the lifetime of the battery 103 can be increased by about 15%.

As shown on FIG. 1, the battery monitoring module 101 may further comprise a fourth interface 123, such as a Digital to Analog Converter, DAC. Through the DAC 123, the battery monitoring module 102 is configured to increase the voltage that is applied to the battery 103 and to the RTC 104. This enables to store more power in battery. The counterpart is that it limits the life cycle of the battery, which is however compensated by the above technical features of the invention. Therefore, a minimum autonomy (40 days for example) during a minimum life cycle (such as 10 years for example) can be ensured even when the power stored in the battery 103 exceeds the nominal power of the battery. This embodiment therefore enables to use the same battery architecture with different RTC consuming different levels of power.

The battery monitoring module 101 may further comprise an internal clock, such as a Real Time Clock, RTC, or may access to an external clock, such as the device 104, so as to measure time and to manage the timing of the operations described below.

The battery monitoring module may comprise and control a load-shedding system (not represented on the figures). In particular, in case of current overload, and in the case where the battery is in charge of powering equipments other than the device 104, some of the other equipments may be relieved and disconnected from the battery by the load-shedding system, to enable powering of the device 104 without interruption.

Figure 7:
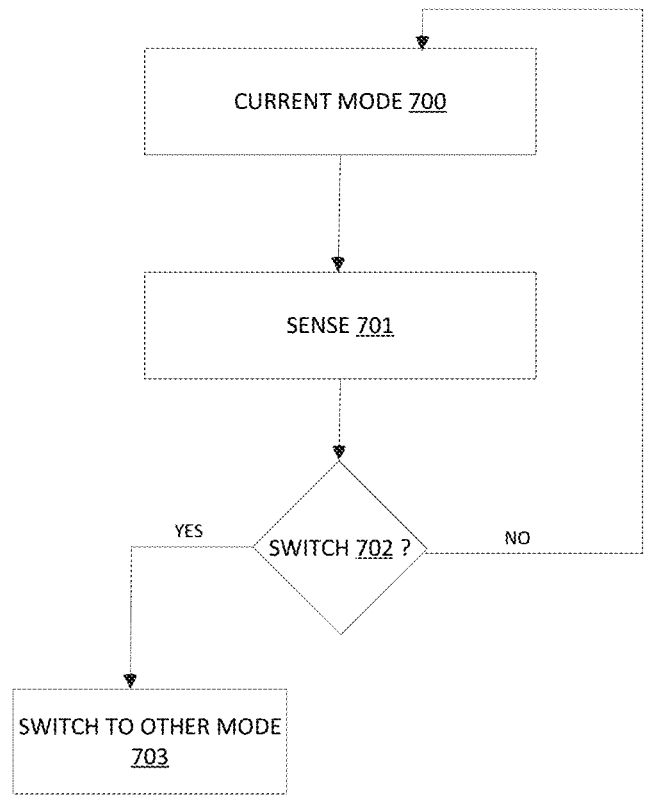
FIG. 7 is a flowchart showing the steps or operations of a method according to some embodiments of the invention.

FIG. 7 is a flowchart showing the steps or operations of a method according to some embodiments of the invention.

At step 700, the system according to the invention is in a current mode among the first mode or in the second mode.

At step 701, data related to the battery is sensed, by one of the sensors. As mentioned above, the data can be the voltage, the discharge current and/or the temperature/humidity/pressure/vibration of the battery 102.

At step 702, the battery monitoring module 102 determines, based on the current mode, the sensed data and a predefined characteristic curve of the battery, whether to switch the switch 103 or not.

If it is determined to switch the switch 103 at step 702, the battery monitoring module 102 switches from the current mode to the other mode at step 703. The other mode is then considered as current mode at step 700.

Else, the method goes back to step 700 and the battery monitoring module 102 remains in the current mode.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the present disclosure. In addition, it is specifically contemplated that a particular feature described, either individually or as part of an embodiment, can be combined with other individually described features, or parts of other embodiments.

The invention claimed is:

1. A system for controlling supply of power to a device comprising:
    a battery;
    a power supply;
    a switch;
    the device being alternatively powered by the battery or by the power supply;
    at least one sensor being configured for sensing data that impacts operation and lifetime of the battery;
    a battery monitoring module operatively coupled to the switch and configured to control the switch for switching, based at least on the data and at least one predefined curve, between a first mode where a load and the battery are powered by the power supply and a second mode where the device is powered by the battery, said predefined curve being a characteristic curve of the battery,
    wherein the at least one sensor comprises at least one of:
        a temperature sensor arranged for sensing a temperature of the battery;
        a humidity sensor arranged for sensing a humidity ratio of an environment of the battery;
        a pressure sensor arranged for sensing pressure of the environment of the battery;
        a vibration sensor arranged for sensing vibrations around the battery; or
        a shunt and an ampere meter arranged for determining a load value applied to the battery.

2. The system according to claim 1, wherein the at least one predefined curve represents voltage of the battery depending on a discharge of the battery, for several temperature values;
    wherein the at least one sensor comprises a temperature sensor arranged for sensing a temperature of the battery.

3. The system according to claim 1, wherein the at least one predefined curve represents voltage of the battery depending on a discharge of the battery, for several load values; and
    wherein the at least one sensor comprises a shunt and an amperemeter arranged for measuring a load value applied to the battery.

4. The system according to claim 2, wherein the battery monitoring module determines, based on the at least one predefined curve and based on a maximum discharge speed, a minimum voltage value of the battery, and, when in the second state, if the voltage of the battery reaches the minimum voltage value, the battery monitoring module switches in the first mode.

5. The system according to claim 1, wherein the switch has a controllable slew rate and wherein the slew rate of the switch is below a predefined value.

6. The system according to claim 5, wherein the switch has a switching speed greater than 10 kHz.

7. The system according to claim 1, wherein the battery is powered by a voltage regulator between said battery and the power supply in the first mode.

8. The system according to claim 7, further comprising a current limiter between the voltage regulator and the battery, wherein the current limiter is configured to limit a charge current delivered to the battery in the first mode.

9. The system according to claim 1, wherein the battery monitoring module is further configured for controlling environment conditions of the battery based on the data.

10. The system according to claim 1, wherein the battery monitoring module comprises a counter, wherein the counter is configured to be launched when the battery monitoring module switches to the first mode, and wherein, if the counter reaches a prefixed counter value, the battery monitoring module switches to the second mode.

11. The system according to claim 1, wherein the at least one characteristic curve represents a variation of a battery capacity depending on a number of charge cycles.

12. The system according to claim 1, wherein the battery is a solid-state battery.

13. The system according to claim 1, wherein the device is a real-time clock.

14. The system according to claim 1, wherein the battery monitoring module further comprises an interface configured for increasing the voltage that is delivered by the power supply.

15. A method for controlling supply of power to a device in a system comprising a device, a power supply, a switch and at least one sensor, the device being alternatively powered by a battery or by a power supply, the method comprising the following operations:

sensing, by the at least one sensor, data that impacts operation and lifetime of the battery;

controlling a switch for switching, based at least on the data and one at least one predefined curve, between a first mode where a load and the battery are powered by the power supply, and a second mode where the device is powered by the battery, said predefined curve being a characteristic curve of the battery, wherein the at least one sensor comprises at least one of:
- a temperature sensor arranged for sensing a temperature of the battery;
- a humidity sensor arranged for sensing a humidity ratio of an environment of the battery;
- a pressure sensor arranged for sensing pressure of the environment of the battery;
- a vibration sensor arranged for sensing vibrations around the battery; or
- a shunt and an ampere meter arranged for determining a load value applied to the battery.

16. The system according to claim 1, wherein the at least one sensor comprises at least one of:
- the humidity sensor arranged for sensing a humidity ratio of an environment of the battery;
- the pressure sensor arranged for sensing pressure of the environment of the battery;
- the vibration sensor arranged for sensing vibrations around the battery; or
- the shunt and the ampere meter arranged for determining a load value applied to the battery.

* * * * *